United States Patent [19]

Nishihara

[11] Patent Number: 5,159,155
[45] Date of Patent: Oct. 27, 1992

[54] ELECTRIC CONNECTION BOX

[75] Inventor: Masahiko Nishihara, Shizuoka, Japan

[73] Assignee: Yazaki Corporation, Tokyo, Japan

[21] Appl. No.: 563,386

[22] Filed: Aug. 7, 1990

[30] Foreign Application Priority Data

Aug. 9, 1989 [JP] Japan .................................. 1-92953

[51] Int. Cl.5 ............................................... H05K 5/00
[52] U.S. Cl. ....................................... 174/50; 220/374; 220/DIG. 6
[58] Field of Search ........................ 174/50, 52.1, 17 R, 174/17 VA, 17 CT; 220/DIG. 6, 205, 374

[56] References Cited

U.S. PATENT DOCUMENTS

| 3,072,284 | 1/1963 | Luhman, Jr. | 220/374 |
| 4,609,126 | 9/1986 | Janda | 220/374 |
| 4,871,884 | 10/1989 | Hayashi | 174/52.1 |

Primary Examiner—Leo P. Picard
Assistant Examiner—D. A. Tone
Attorney, Agent, or Firm—Sughrue, Mion, Zinn Macpeak & Seas

[57] ABSTRACT

Water is prevented from entering an electric connection box by providing an additional cover with a drain port out of register with drain ports on a normally-provided bottom cover. Baffles between the drain ports on the bottom cover and the drain port on the additional cover provide additional protection.

1 Claim, 3 Drawing Sheets

ELECTRIC CONNECTION BOX

BACKGROUND OF THE INVENTION

This invention relates to an electric connection box used for interconnection of wire harnesses or the like, and more particularly to an improved drain construction of such an electric connection box.

Conventionally, drain ports are provided in a reverse cover of an electric connection box used in an engine room. FIG. 4 shows one such example. An electric connection box body 1 has a front cover 2 and a reverse cover 3 placed on opposite sides thereof. A plurality of drain ports 4 are formed through the reverse cover 3. A connector 5 connects electric elements such as a fuse, a relay and so on. Reference numeral 6 denotes an electricity-leading hole.

In such a drain construction, when a vehicle is running on a bad road or on a rainy day, water droplets pass through the drain ports 4 towards the body 1 because of water splashing, or the like, from the underside of the vehicle, causing rust of terminals of a connector and circuit conductors within the electric connection box body 1, and also causing leakage, thus causing degradation of performance.

In order to improve such a situation, there has been proposed a construction (Japanese Laid-Open (Kokai) Utility Model Application No. 131519/88) in which, as shown in FIG. 5, a wall portion 8 is provided in opposed relation to a drain port 4 through a bottom wall 3a of a reverse cover 3, with an opening 7 provided between the two, thereby preventing water splashes or the like from intruding directly through the drain port 4.

However, water may still intrude through the opening 7, as indicated by the arrows, even if the wall portion 8 closing the drain port 4 in the reverse cover 3 is provided. Particularly when washing a vehicle with water at high pressure, this tendency is conspicuous. It would be desirable to develop a drain construction capable of shutting off water applied from the exterior.

SUMMARY OF THE INVENTION

To meet the above requirement, it is an object of this invention to provide an electric connection box which has a simple construction, and is free from the possibility that water droplets or the like will intrude into the electric connection box through drain ports.

According to the present invention, there is provided an electric connection box having an auxiliary cover removably attached to a reverse cover of said electric connection box, a drain port of said auxiliary cover being disposed out of register with a drain port of said reverse cover.

Preferably, a baffle plate is formed on one of said reverse cover and said auxiliary cover so as to prevent water from advancing straight from said drain port of said auxiliary cover toward said drain port of said reverse cover.

In the invention, the auxiliary cover is attached to the reverse cover of the electric connection box, and therefore water will not intrude into the box through the drain port of the reverse cover, thus greatly improving waterproofness. The provision of the baffle plate further enhances this effect.

The auxiliary cover is used when the electric connection box is used at a place into which water is liable to intrude, such as an engine room, and the attachment and detachment of the auxiliary cover can be selected suitably according to the place where the electric connection box is to be used.

Further, the use of the auxiliary cover almost entirely eliminates the possibility of reverse intrusion of water through the drain port of the reverse cover. As a result, the size of the drain port of the reverse cover can be increased, thus enhancing the drainage of the electric connection box.

DETAILED DESCRIPTION OF THE PREFERRED EMBODIMENTS

Figure 1:
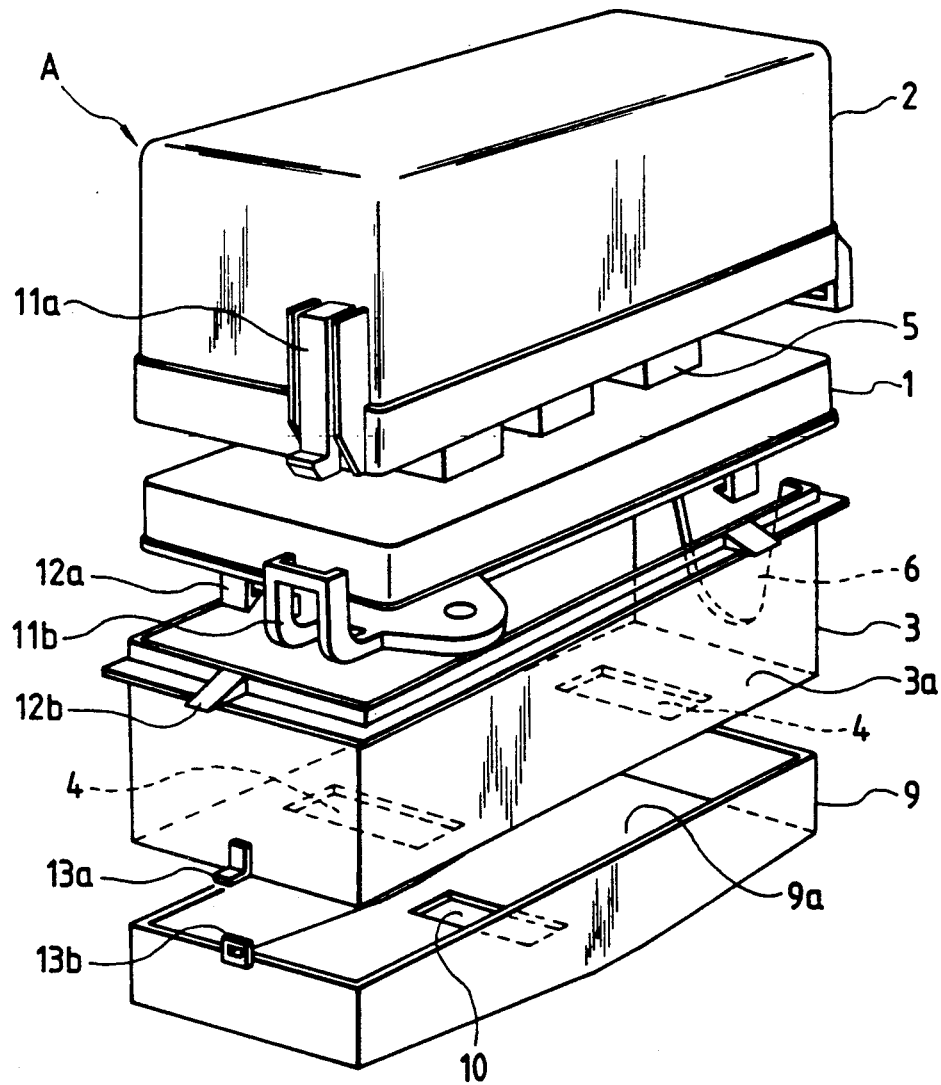
FIG. 1 is an exploded perspective view of an electric connection box according to the invention.
Figure 2:
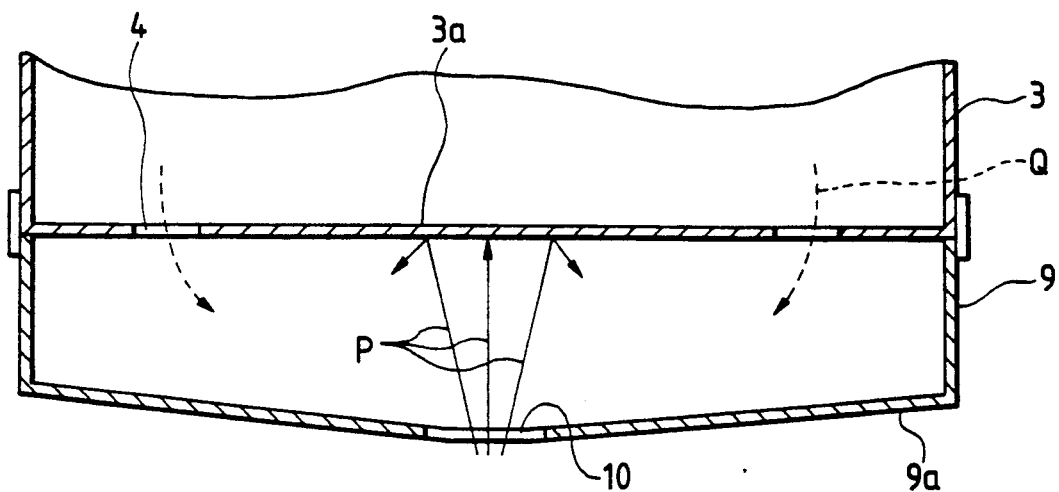
FIG. 2 is a cross-sectional view of an important portion of the electric connection box, showing an operative condition thereof.
Figure 4:
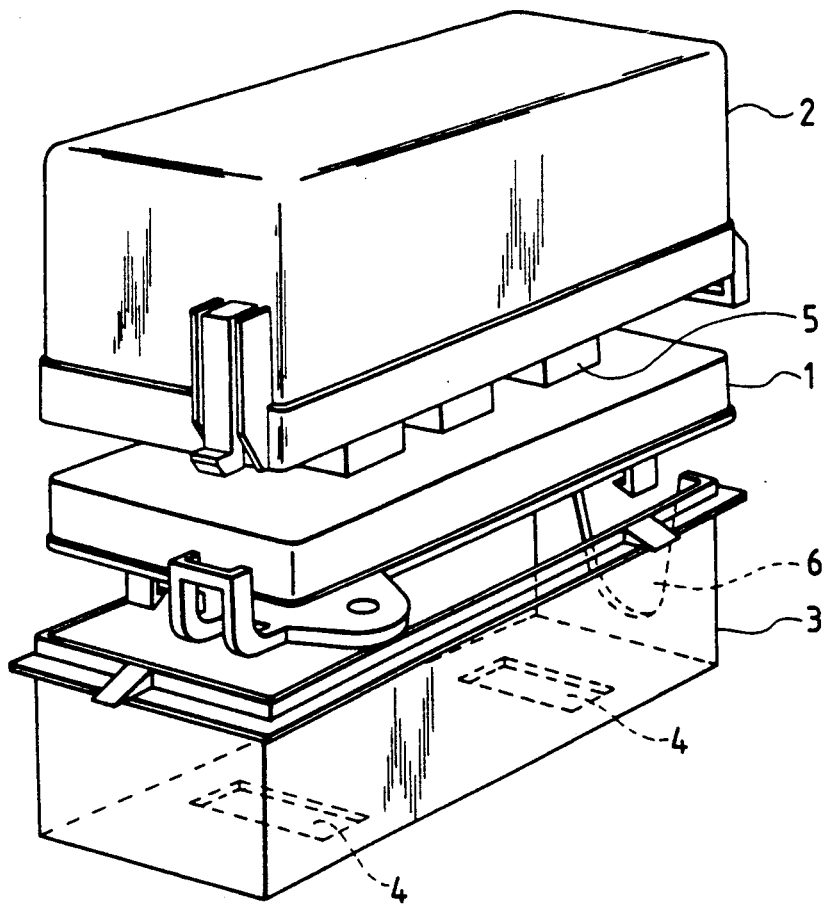
FIG. 4 is an exploded perspective view of a conventional electric connection box.
Figure 5:
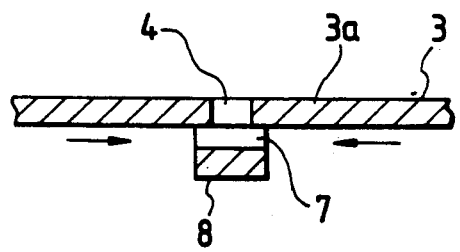
FIG. 5 is a cross-sectional view of a portion of another conventional electric connection box.

In FIGS. 1 and 2, those portions which are the same as those of FIGS. 4 and 5 are designated by identical reference numerals, respectively, and explanation of such portions accordingly will be simplified. The electric connection box A includes an electric connection box body 1, a front cover 2, a reverse cover 3, and an auxiliary cover 9 which are selectively attached as needed.

Rectangularly-shaped drain ports 4 are formed respectively through right and left side portions of a bottom wall 3a of the reverse cover 3. A drain port 10 having a tapered configuration is formed through the central portion of the auxiliary cover 9, and is disposed out of register with the drain ports 4.

A first lock 11a, 11b is provided for locking the front cover 2 and the body relative to each other, a second lock 12a, 12b is provided for locking the body 1 and the reverse cover 3 relative to each other, and a third lock 13a, 13b is provided for locking the reverse cover 3 and the auxiliary cover 9.

As shown in FIG. 2, even if water droplets, due to water at high pressure, for example, when washing a vehicle, intrude through the drain port 10 of the auxiliary cover 9, most of the water is bounced back by the reverse cover 3 as indicated by arrows, thus reducing the possibility that the water will intrude into the electric connection box through the drain ports 4.

On the other hand, if condensation is formed on the electric connection box as a result of a large temperature variation in the engine room, such condensation water flows through the drain ports 4 into the auxiliary cover 9, and further is discharged to the exterior via the drain port 10.

Figure 3:
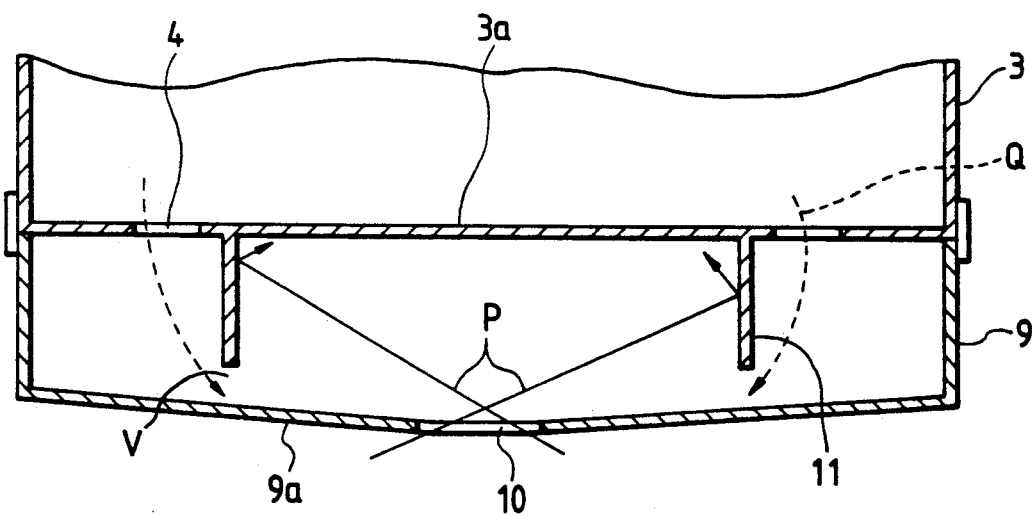
FIG. 3 is a cross-sectional view of an important portion of a modified electric connection box according to the invention.

FIG. 3 shows another embodiment of the invention, in which two baffle plates 11 are formed on and project from the lower surface of the reverse cover, and are disposed respectively on the opposite sides of the drain port 10 of the auxiliary cover 9. A water passage gap V is provided between the distal end of each baffle plate 11 and the auxiliary cover 9. The baffle plates 11 may be formed on the auxiliary cover 9.

In this case, water droplets or water splashes, advancing straight obliquely from the drain port 10 of the auxiliary cover 9 toward the drain ports 4, are bounced back by the baffle plates 11 as indicated by arrows P', and therefore a intrusion of this water into the reverse cover 3 is substantially completely prevented.

As described above, according to the invention, with a quite simple construction, the intrusion of water into the electric connection box through the drain ports of the reverse cover can be effectively prevented without affecting the drain function.

While the invention has been described in detail above with reference to a preferred embodiment, various modifications within the scope and spirit of the invention will be apparent to people of working skill in this technological field. Thus, the invention should be considered as limited only by the scope of the appended claims.

What is claimed is:

1. An electrical connection box, comprising:
   a first cover having a first drain port, attached to one side of said electrical connection box;
   an auxiliary cover removably attached to said first cover and having a second drain port, said second drain port being disposed out of register with said first drain port, said first cover being disposed between said electrical connection box and said auxiliary cover; and a baffle plate formed on said first cover so as to intersect a line between said first and second drain ports, thus preventing water from advancing in a straight line from said second drain port toward said first drain port, wherein said baffle plate extends substantially perpendicularly from said first cover at a location between said first and second drain ports.

* * * * *